United States Patent
Manyoki et al.

(10) Patent No.: US 6,259,641 B1
(45) Date of Patent: Jul. 10, 2001

(54) INTEGRATED MEMORY HAVING SENSE AMPLIFIERS DISPOSED ON OPPOSITE SIDES OF A CELL ARRAY

(75) Inventors: Zoltan Manyoki, Kanata (CA); Thomas Röhr, Aschheim; Thomas Böhm, Zorneding, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/560,545

(22) Filed: Apr. 28, 2000

(30) Foreign Application Priority Data

Apr. 28, 1999 (DE) .............................................. 199 19 359

(51) Int. Cl.⁷ ...................................................... G11C 7/00
(52) U.S. Cl. ............................................................. 365/205
(58) Field of Search ................................... 365/205, 203, 365/207

(56) References Cited

U.S. PATENT DOCUMENTS

| | | | |
|---|---|---|---|
| 4,050,061 | 9/1977 | Kitagawa | 340/173 |
| 5,594,701 | * 1/1997 | Asaka et al. | 365/230.03 |
| 5,671,174 | 9/1997 | Koike et al. | 365/145 |
| 5,978,250 | * 11/1999 | Chung et al. | 365/145 |
| 6,134,169 | * 10/2000 | Tanaka | 365/222 |

FOREIGN PATENT DOCUMENTS 32 22 461 A1   12/1982   (DE) .

OTHER PUBLICATIONS

"The Charge–Share Modified (CSM) Precharge–Level Architecture for High–Speed . . . "(Fujisawa et al.), dated May 1997, IEEE Journal of Solid–State Circuits, vol. 32, No. 5, as mentioned on p. 1 of the specification.

* cited by examiner

*Primary Examiner*—Richard Elms
*Assistant Examiner*—Anh Phung
(74) *Attorney, Agent, or Firm*—Herbert L. Lerner; Laurence A. Greenberg; Werner H. Stemer

(57) ABSTRACT

An integrated memory includes a cell array having memory cells disposed at points of intersection of first bit lines and second bit lines with word lines in the cell array. When one of the memory cells is addressed, the memory content is not affected if respective bit lines associated with each of the memory cells are at a standby potential. Sense amplifiers for amplifying data read from the memory cells onto the bit lines are included, each associated with respective first and second bit lines and disposed on opposite sides of the cell array. Also provided are first switching elements, through which each bit line is connected to the associated sense amplifier, and second switching elements, through which each bit line is connected, on that side of its first switching element which is remote from the associated sense amplifier, to a standby potential. Column selection lines are each connected to the control connections of the first and second switching elements in at least one of the first and one of the second bit lines. Each bit line is connected to the standby potential through third switching elements. A first control line is connected to all the third switching elements in the first bit lines, and a second control line is connected to all the third switching elements in the second bit lines.

5 Claims, 2 Drawing Sheets

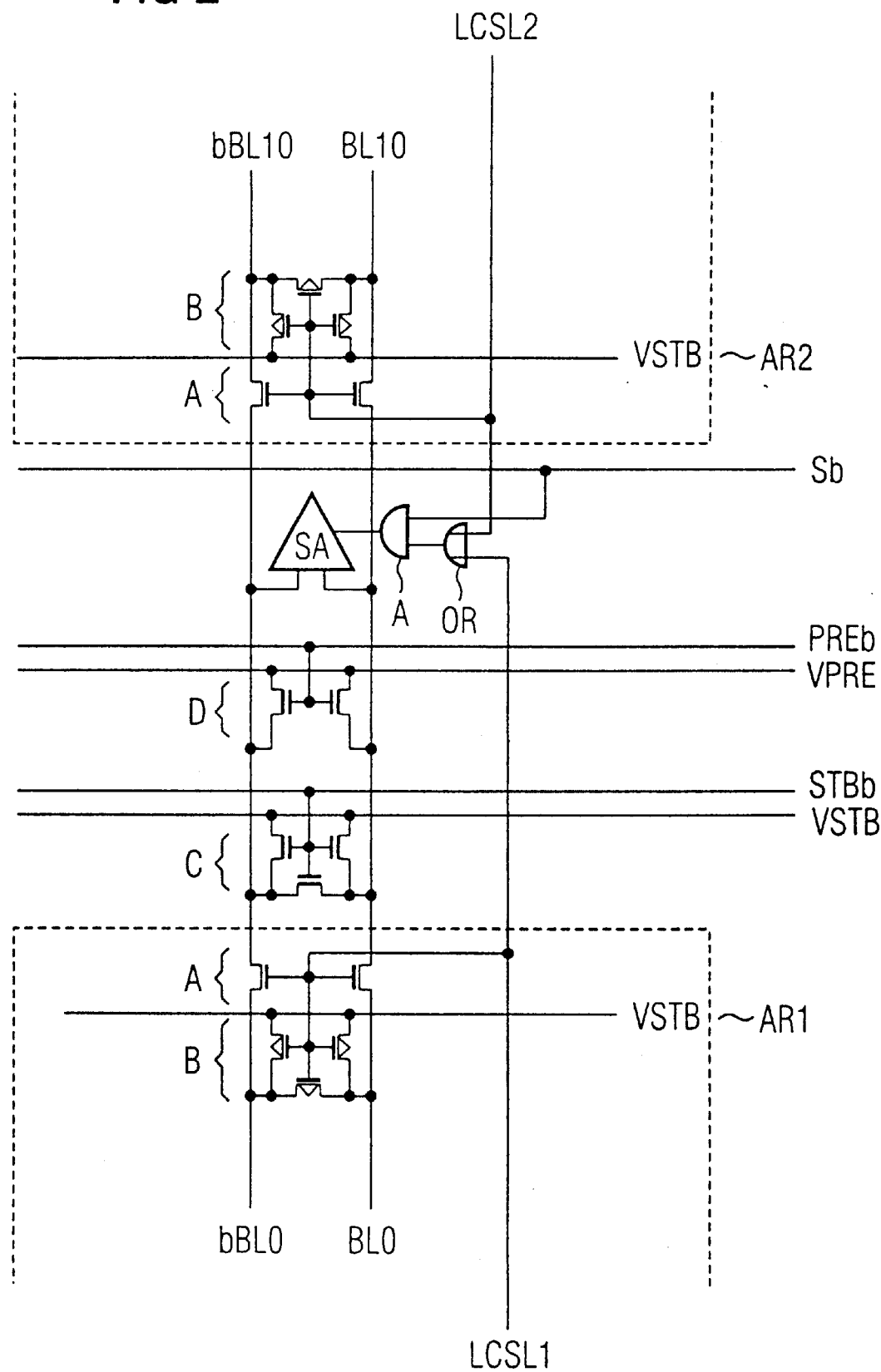

US 6,259,641 B1

INTEGRATED MEMORY HAVING SENSE AMPLIFIERS DISPOSED ON OPPOSITE SIDES OF A CELL ARRAY

BACKGROUND OF THE INVENTION

FIELD OF THE INVENTION

The invention relates to an integrated memory having sense amplifiers disposed on opposite sides of a cell array.

The article, The Charge-Share Modified (CSM) Precharge-Level Architecture for High-Speed and Low-Power Ferroelectric Memory, H. Fujisawa et al., in IEEE Journal of Solid-State Circuits, Vol. 32, No 5, May 1997, page 655 ff. describes a ferroelectric memory (FeRAM or RAM) whose memory cells are of the one-transistor/one-capacitor type. The storage capacitor has a ferroelectric dielectric. The memory cells are disposed at points of intersection of bit lines and word lines. The bit lines are connected to a common sense amplifier through n-channel transistors. In addition, each bit line is connected through a p-channel transistor to a plate potential, to which the electrode of each storage capacitor remote from the selection transistor is also connected. The control connection of the n-channel transistor and of the p-channel transistor in each bit line is connected to a column selection line. Only one of the bit lines is ever accessed at the same time using the column selection lines, the bit line then being conductively connected to the sense amplifier through its n-channel transistor. The other column selection lines remain at a low level, so that the associated bit lines are conductively connected to the plate potential. Although, when one of the word lines is activated, one of the selection transistors in the memory cells on each bit line is turned on, the state stored in the storage capacitors in the unselected bit lines is not affected because the p-channel transistors cause the plate potential to be present on both electrodes of the capacitors. A voltage drop of 0 V across a ferroelectric storage capacitor does not change the polarity of the capacitor. The polarity affects the capacitance of the storage capacitor and corresponds to a particular stored logic state.

In integrated memories, the memory cells disposed at points of intersection of adjacent bit lines and word lines form cohesive cell arrays. If each bit line has to have an appropriate sense amplifier allocated to it, it is beneficial to dispose the sense amplifiers not only on one side of the cell array but alternately on opposite sides of the cell array. Then, there is more space available for configuring the components of the sense amplifiers.

In integrated memories, a plurality of adjacent bit lines is often combined to form a common column having an associated column selection signal. If one of the column selection lines is activated, sense amplifiers on both sides of the cell array are then connected to the bit lines in the appropriate columns and, during read access, amplify the signals read from the addressed memory cells onto these bit lines. To ensure that the surface requirement for the column selection lines in the cell array does not become too large, the column selection lines must be limited in number. On the other hand, limiting the number of column selection lines means that each column selection line has a relatively large number of associated bit lines. Accordingly, during any memory access, a large number of sense amplifiers need to be activated at the same time. Activating more sense amplifiers at the same time increases the power consumption of the integrated memory. In memory cells whose content is destroyed during read access, the sense amplifier is used for writing back the data that has just been read out. Consequently, all the sense amplifiers connected to selected bit lines must be activated normally. Such is the case for DRAMs and FRAMs.

SUMMARY OF THE INVENTION

It is accordingly an object of the invention to provide an integrated memory having sense amplifiers disposed on opposite sides of a cell array that overcomes the hereinafore-mentioned disadvantages of the heretofore-known devices of this general type and that reduces the power consumption compared to conventional solutions for the same ratio of the number of column selection lines to the number of bit lines, that is to say, when the surface requirement of the column selection lines in the cell array is constant.

With the foregoing and other objects in view, there is provided, in accordance with the invention, an integrated memory, including at least one cell array having bit lines including first and second bit lines, word lines, and memory cells disposed at points of intersection of the first and second bit lines with the word lines in the at least one cell array, the memory cells each having a memory content, and, when one of the memory cells is addressed, the memory content of the memory cells is not affected provided respective bit lines of the bit lines associated with each of the memory cells are at a standby potential, sense amplifiers disposed on opposite sides of the at least one cell array for amplifying data read from the memory cells onto the bit lines, the sense amplifiers each associated with respective ones of the first and second bit lines, first switching elements having first control connections, the first switching elements connecting each of the bit lines to a respectively associated one of the sense amplifiers, the first switching elements being on when a first logic state appears at the first control connections, second switching elements having second control connections, the second switching elements connecting each of the bit lines to the standby potential on a side of a respective one of the first switching elements remote from an associated sense amplifier, the second switching elements being on when a second logic state appears at the second control connections, column selection lines each connected to the first control connections and the second control connections in at least one of the first bit lines and at least one of the second bit lines, third switching elements connecting each of the bit lines to the standby potential, the third switching elements each having a control input, a first control line connected to the control input of each of the third switching elements in the first bit lines , and a second control line connected to the control input of each of the third switching elements in the second bit lines.

The memory according to the invention has first switching elements, through which each bit line is connected to the associated sense amplifier, and second switching elements, through which each bit line is connected to a standby potential. The first and second switching elements in each bit line are connected to a column selection line. In addition to the first and second switching elements, the memory has third switching elements, through which each bit line is likewise connected to the standby potential. A first control line is connected to a respective control input of all the third switching elements in the first bit lines, which are associated with sense amplifiers on a first side of the cell array. A second control line is connected to a respective control input of all the third switching elements in the second bit lines, which are associated with sense amplifiers on a second side of the cell array.

Thus, in the memory according to the invention, the bit lines are selected not only through the column selection lines, but also through the first and the second control line. Advantageously, during operation of the memory, only one of the two control lines can be brought to a potential that disables the associated third switching elements. Then, although all the bit lines in a column selected through the column selection line are conductively connected to the associated sense amplifier through the first switching elements, those bit lines whose third switching elements are turned on through the appropriate control line are still at the standby potential. Thus, the two control lines can be used to select whether the first or the second bit lines in a selected column are to be accessed during memory access. Accordingly, only half of the sense amplifiers associated with the bit lines in a column need then be activated at the same time. Therefore, the configuration results in a fifty-percent reduction of the power consumption of the sense amplifiers.

Due to the fact that only one of the two activation lines need ever be activated at the same time, the invention permits a considerable reduction in power consumption because, during memory access, the sense amplifiers generally need to be activated through appropriate activation lines disposed on both sides of the cell array. The activation lines are very long because the cell arrays of integrated memories often have very large dimensions and the activation lines for the sense amplifiers run over the whole width of the associated cell array. The line capacitance is also correspondingly high. Thus, a very large amount of power is required to recharge the activation lines. Because the invention permits only one of the two activation lines in a cell array to be activated during memory access, the considerable power consumption can be reduced by half.

In accordance with another feature of the invention, respective ones of the third switching elements are disposed on a side of respective ones of the first switching elements in an appropriate bit line of the bit lines facing an associated sense amplifier of the sense amplifiers.

According to one development, the third switching elements are disposed on that side of the first switching element in the appropriate bit line that is facing the associated sense amplifier. Thus, the third switching elements, like the sense amplifiers, are disposed at the edge of the cell array, where there is more space available than inside the cell array.

In accordance with a further feature of the invention, the column selection lines run essentially parallel to the bit lines, and the first control line and the second control line run essentially parallel to the word lines.

It is beneficial if the column selection lines run essentially parallel to the bit lines, and the first and second control lines run essentially parallel to the word lines. The placement produces a particularly space-saving configuration of the appropriate lines.

In accordance with an added feature of the invention, there are provided fourth switching elements connecting each of the bit lines to a precharge potential, the fourth switching elements each having a control input, a first precharge control line connected to a respective control input of all of the fourth switching elements in the first bit lines, and a second precharge control line connected to a respective control input of all of the fourth switching elements in the second bit lines.

In accordance with a concomitant feature of the invention, the integrated memory is a ferroelectric memory and each of the memory cells have a selection transistor and a storage capacitor with a ferroelectric dielectric.

The invention is particularly suited for use in ferroelectric memories with storage capacitors having a ferroelectric dielectric. However, the invention can also be applied to other memories in which no access to the memory cells is permitted when the associated bit line is held at a standby potential with the selection transistor turned on.

Other features that are considered as characteristic for the invention are set forth in the appended claims.

Although the invention is illustrated and described herein as embodied in integrated memory having sense amplifiers disposed on opposite sides of a cell array, it is nevertheless not intended to be limited to the details shown because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a detailed circuit diagram of two adjacent cell arrays in the integrated memory of FIG. 1.

DESCRIPTION OF THE PREFERRED EMBODIMENTS

Figure 1:
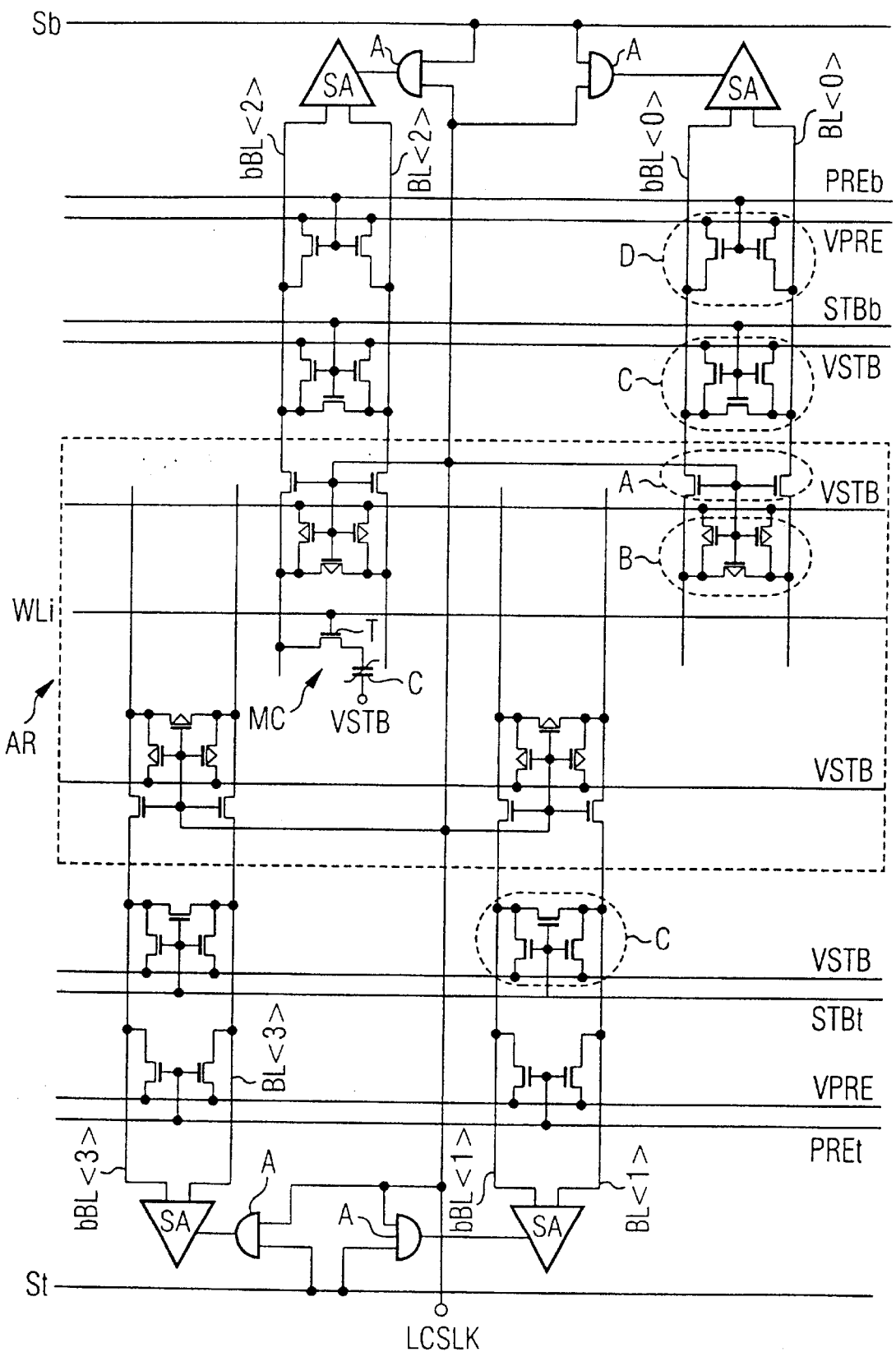
FIG. 1 is a circuit diagram of a cell array in an integrated memory according to the invention.

In all the figures of the drawing, sub-features and integral parts that correspond to one another bear the same reference symbol in each case.

Referring now to the figures of the drawings in detail and first, particularly to FIG. 1 thereof, there is shown a detail of an integrated FRAM-type memory according to the invention. The memory has a multiplicity of memory cells MC (only one of which has been illustrated in FIG. 1) in a cell array AR. Each memory cell MC has a selection transistor T and a storage capacitor C with a ferroelectric dielectric. The memory cells MC are disposed at points of intersection of bit lines BLi, bBLi with word lines WLi. One electrode of the storage capacitor C in each memory cell MC is connected to a standby potential VSTB, and the other electrode is connected through the selection transistor T to the associated bit line. The gate of the selection transistor T is connected to the associated word line. The memory has a multiplicity of the bit lines and word lines. In FIG. 1, however, only one of the word lines WLi has been illustrated. Also, FIG. 1 illustrates four bit line pairs forming a column having an associated common column selection line LCSLk. The other bit lines (not illustrated in FIG. 1) are also combined to form columns each having four bit line pairs. These further columns are of the same configuration as the column shown in FIG. 1. The word lines WLi are connected to outputs of a non-illustrated line decoder. The column selection lines LCSLk are connected to outputs of a non-illustrated column decoder.

Each bit line pair BLi, bBLi has an associated sense amplifier SA. The bit line pairs are disposed in the "interleaved bit line architecture". Thus, the sense amplifiers SA for adjacent bit line pairs are disposed alternately at opposite edges of the cell array AR. The configuration makes more space available for producing each sense amplifier SA than if all the sense amplifiers SA were disposed on the same side of the cell array AR.

Each bit line BLi, bBLi is connected through a first transistor A of n-channel type to the associated sense amplifier SA. At each of the two edges of the cell array AR, a line for the standby potential VSTB runs parallel to the word lines WLi. The first transistors A have associated second transistors B of the p-channel type that connect the respective bit line on the side remote from the associated sense amplifier SA to the standby potential VSTB and to the other bit line in the respective bit line pair. In addition, each sense amplifier SA has associated third transistors C of the n-channel type that likewise connect each of the two bit lines associated with the sensor amplifier SA to the standby potential VSTB and to one another. Each sense amplifier SA also has associated fourth transistors D of the n-channel type that connect the two bit lines associated with the sense amplifier SA to a precharge potential VPRE.

Running parallel to the bit lines BLi, bBLi are the column selection lines LCSLk. The column selection lines LCSLk are connected at the edge of the cell array to the control connections of the first transistors A and of the second transistors B in the associated column. Furthermore, there is a first control line STBb and a second control line STBt, that are disposed parallel to the word line WLi and are connected to the control connections of the third transistors C, disposed on the respective side of the cell array AR, in all columns. The memory also has a first precharge control line PREb and a second precharge control line PREt, which are disposed at the upper and lower edges of the cell array AR and are connected to the control connections of the fourth transistors D, disposed there, in all columns. The first control line STBb and the first precharge control line PREb are associated with all the bit line pairs BLi, bBLi that are connected to the upper sense amplifiers SA disposed at the edge of the cell array. While each column selection line LCSLk is associated only with the respective four bit line pairs in each column within the cell array AR. The second control line STBt and the second precharge control line PREt are associated with all the bit line pairs in the cell array AR that are connected to the sense amplifiers SA disposed at the lower edge of the cell array.

The operation of the memory shown in FIG. 1 works is as follows:

Provided that none of the columns have been selected, all the column selection lines LCSLk are at low potential, so that the first transistors A are off and the second transistors B are on. Thus, the bit lines BLi, bBLi at the edge of the cell array AR are decoupled from the sense amplifiers SA and are at the standby potential VSTB. In addition, all the word lines WLi are at the low potential, so that all the selection transistors T in the memory cells MC are off.

During read access to the memory, one of the column selection lines LCSLk is brought to a high potential based on an applied column address, so that the first transistors A in the one column are turned on and the second transistors B in the column are turned off. At the same time, one of the control lines STBb, STBt is at a high level and the other control line is at a low level. The third transistors C, whose associated control line STBb or STBt is at the high level, ensure that the associated bit lines BLi, bBLi remain at the standby potential VSTB even when the first transistors A are on. Thus, the standby potential VSTB for the appropriate memory cells MC in these bit lines is applied to the two electrodes of the storage capacitor C so that the stored logic state of these memory cells is not affected.

In addition, that precharge control line PREb, PREt whose associated control line STBb, STEt is at the low level is brought to the high level. Thus, those bit lines that are not conductively connected to the standby potential VSTB through their third transistors C are conductively connected to the precharge potential VPRE through their fourth transistors D. Before one of the word lines WLi is activated, the fourth transistors D are turned off again as a result of the associated precharge control line PREb, PREt assuming a low level again. One of the word lines WLi is then brought to the high level, so that, for each bit line pair BLi, bBLi, the selection transistor T in one of the memory cells MC is turned on.

The memory content of those memory cells MC whose associated column selection line LCSLk is at a low level is not affected during memory access because the associated bit lines are conductively connected to the standby potential VSTB through the second transistors B. In addition, there is no effect on the memory content of those memory cells MC whose column selection line LCSLk is, admittedly, at a high level, but whose associated control line STBb, STBt is also at a high level. There is not effect because these memory cells MC are likewise connected to the standby potential VSTB through the turned-on first transistors A and the turned-on third transistors C. Read access is gained only to those memory cells MC whose column selection lines LCSLk a re at a high level and whose associated control line STBb, STBt is at a low level. For these memory cells MC, the appropriate bit lines have been precharged to the precharge potential VPRE through the turned-on first transistors A and fourth transistors D. One electrode of the appropriate storage capacitor C in these memory cells MC is then at the precharge potential VPRE, while that electrode of the capacitors C that is remote from the selection transistor T is at the standby potential VSTB. Because, in the case of the last-named memory cells MC, the voltage across the storage capacitor C is not equal to 0 V, these memory cells are read. Depending on the logic state stored in the last-named memory cells MC, the potential on the bit lines connected thereto is affected in different ways. Consequently, an appropriate difference signal is produced at the two inputs of the associated sense amplifier SA. The sense amplifiers SA amplify the difference signal and pass it on to outside the integrated memory. At the same time, the amplified difference signal is written back by the sense amplifiers into the memory cells MC that were read, their memory content having been destroyed during reading.

In the memory shown in FIG. 1, all the sense amplifiers SA disposed at the upper edge of the cell array AR have an associated first activation line Sb, while the sense amplifiers SA at the lower edge of the cell array AR have an associated second activation line St. During memory access, the activation lines Sb, St are used to activate only those sense amplifiers SA whose associated bit lines BLi, bBLI are to be accessed. In addition, the sense amplifiers SA are supplied with the associated column selection signal LCSLk to activate them, so that not all the sense amplifiers SA at the lower and upper edges of the cell array AR are activated at the same time, but only those sense amplifiers SA that are disposed on the appropriate side of the cell array AR and are additionally associated with the respectively addressed column. In the memory of the illustrative embodiment, the sense amplifiers SA are activated by an AND gate A whose output is connected to an activation input on the appropriate sense amplifier SA, whose first input is connected to the respective column selection line LCSLk, and whose second input is connected to the appropriate upper activation line Sb or lower activation line St.

In the memory described here, the column selection lines LCLSk are, thus, used to select, at all times, four bit line pairs BLi, bBLi at the same time. The control lines STBb, STBt are then used for a further subselection of two of these four selected bit line pairs. The activation lines Sb, St are then used to activate only the two sense amplifiers SA associated with these bit line pairs. Therefore, in the memory according to the invention, the number of bit lines associated with one of the column selection lines LCSLk differs from the number of sense amplifiers SA that are to be activated at the same time during memory access. As such, the invention permits the number of bit lines associated with a common column selection line LCSLk (the number being crucial for the number of column selection lines needed overall, and, hence, for the space requirement for the column selection lines within the cell array AR) to be chosen to be twice as high as the number of sense amplifiers SA that are to be activated at the same time.

Because the sense amplifiers SA at the upper and at the lower edge of the cell array AR are each allocated different activation lines Sb, St, which are activated at different instants, the line capacitance thereof, which is to be recharged in each case, is only half as high as if both activation lines were activated at the same time. A marked reduction in the power consumption of the memory results because the dimensions of the cell arrays AR are often very large, and, accordingly, the activation lines Sb, St are very long.

In other illustrative embodiments of the invention, it is also possible for the memory to have two modes of operation: in the first mode of operation, the memory behaves like the memory described with reference to FIG. 1; and, in the second mode of operation, the two control lines STBb, STBt, the two precharge control lines PREb, PREt, and the two activation lines Sb, St are each activated and deactivated at the same time, so that, in the second mode of operation, memory access is gained to all the bit line pairs in a column at the same time. In the first mode of operation, half as many sense amplifiers SA are then active during access to one of the columns than those active in the second mode of operation. In the illustrative embodiment, the control lines, precharge control lines, and activation lines can be used to achieve a different data length and a different power consumption for the memory in the two modes of operation.

In other illustrative embodiments of the invention, the third transistors C can also be disposed on a side of the first transistors A that is remote from the respective sense amplifier SA, in other words, within the cell array AR. However, there is generally much less space available in the cell array AR than at the edge thereof.

FIG. 2 shows another detail of the integrated memory illustrated in FIG. 1. FIG. 2 shows two adjacent cell arrays AR1, AR2 and a respective bit line pair BLi, bBLI within each cell array. In FIG. 2, each sense amplifier SA (only one of which is illustrated in FIG. 2) is associated with a respective bit line pair composing the two cell arrays AR1, AR2. The bit line pairs BLi, bBLi connected to the same sense amplifier SA each has different column selection lines LCSLk associated with them. FIG. 2 also shows that the third transistors C and the fourth transistors D associated with each sense amplifier SA are also associated with two respective bit line pairs.

We claim:

1. An integrated memory, comprising:
at least one cell array having:
bit lines including first bit lines and second bit lines; word lines; and
memory cells disposed at points of intersection of said first bit lines and said second bit lines with said word lines in said at least one cell array, said memory cells each having a memory content, and, when one of said memory cells is addressed, said memory content of said memory cells is not affected provided respective bit lines of said bit lines associated with each of said memory cells are at a standby potential;
sense amplifiers disposed on opposite sides of said at least one cell array for amplifying data read from said memory cells onto said bit lines, said sense amplifiers each associated with respective ones of said first and second bit lines;
first switching elements having first control connections, said first switching elements connecting each of said bit lines to a respectively associated one of said sense amplifiers, said first switching elements being on when a first logic state appears at said first control connections;
second switching elements having second control connections, said second switching elements connecting each of said bit lines to said standby potential on a side of a respective one of said first switching elements remote from an associated sense amplifier, said second switching elements being on when a second logic state appears at said second control connections;
column selection lines each connected to said first control connections and said second control connections in at least one of said first bit lines and at least one of said second bit lines;
third switching elements connecting each of said bit lines to said standby potential, said third switching elements each having a control input;
a first control line connected to said control input of each of said third switching elements in said first bit lines; and
a second control line connected to said control input of each of said third switching elements in said second bit lines.

2. The integrated memory according to claim 1, wherein respective ones of said third switching elements are disposed on a side of respective ones of said first switching elements in an appropriate bit line of said bit lines facing an associated sense amplifier of said sense amplifiers.

3. The integrated memory according to claim 1, wherein said column selection lines run essentially parallel to said bit lines, and said first control line and said second control line run essentially parallel to said word lines.

4. The integrated memory according to claim 1, including fourth switching elements connecting each of said bit lines to a precharge potential, said fourth switching elements each having a control input;
a first precharge control line connected to a respective control input of all of said fourth switching elements in said first bit lines; and
a second precharge control line connected to a respective control input of all of said fourth switching elements in said second bit lines.

5. The integrated memory according to claim 1, wherein the integrated memory is a ferroelectric memory and each of said memory cells have a selection transistor and a storage capacitor with a ferroelectric dielectric.

* * * * *